US007404853B2

(12) United States Patent
Kendall

(10) Patent No.: US 7,404,853 B2
(45) Date of Patent: Jul. 29, 2008

(54) THERMALLY CONDUCTIVE GREASE

(75) Inventor: Philip E. Kendall, Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 19 days.

(21) Appl. No.: 11/459,163

(22) Filed: Jul. 21, 2006

(65) Prior Publication Data
US 2007/0031686 A1 Feb. 8, 2007

Related U.S. Application Data

(63) Continuation-in-part of application No. 11/195,953, filed on Aug. 3, 2005.

(51) Int. Cl.
C09C 1/64 (2006.01)

(52) U.S. Cl. .................. 106/403; 428/334; 428/33; 524/437

(58) Field of Classification Search ................ 106/403; 428/334, 332; 524/437
See application file for complete search history.

(56) References Cited

U.S. PATENT DOCUMENTS

| | | | |
|---|---|---|---|
| 5,094,769 A | 3/1992 | Anderson, Jr. et al. | |
| 5,213,704 A | 5/1993 | Anderson, Jr. et al. | |
| 6,059,116 A | 5/2000 | Hinshaw et al. | |
| 6,111,314 A | 8/2000 | Edwards et al. | |
| 6,143,076 A | 11/2000 | Rasmussen et al. | |
| 6,255,139 B1 | 7/2001 | Edwards et al. | |
| 6,255,257 B1 | 7/2001 | Yamada et al. | |
| 6,372,337 B2 | 4/2002 | Takahashi et al. | |
| 6,424,033 B1 | 7/2002 | Akram | |
| 6,475,962 B1 | 11/2002 | Khatri | |
| 6,496,373 B1 | 12/2002 | Chung | |
| 6,515,061 B1 | 2/2003 | Iruvanti et al. | |
| 6,552,906 B2 | 4/2003 | Kanada | |
| 6,632,780 B2 * | 10/2003 | Uematsu et al. | 508/155 |
| 6,940,722 B2 | 9/2005 | Tetsuka et al. | |
| 6,946,190 B2 * | 9/2005 | Bunyan | 428/334 |
| 2002/0018885 A1 | 2/2002 | Takahashi et al. | |
| 2002/0086801 A1 | 7/2002 | Khatri | |
| 2003/0008961 A1 | 1/2003 | Uematsu | |
| 2003/0152764 A1 | 8/2003 | Bunyan et al. | |
| 2003/0168731 A1 | 9/2003 | Matayabas, Jr. et al. | |
| 2003/0178720 A1 | 9/2003 | Rumer et al. | |
| 2003/0194537 A1 | 10/2003 | Bhagwagar et al. | |
| 2003/0203181 A1 | 10/2003 | Ellsworth, Jr. et al. | |
| 2003/0220432 A1 | 11/2003 | Miller et al. | |
| 2004/0060691 A1 | 4/2004 | Chiu et al. | |
| 2004/0075076 A1 | 4/2004 | Bhagwagar | |
| 2004/0081843 A1 | 4/2004 | Bunyan | |
| 2004/0097635 A1 | 5/2004 | Fan et al. | |
| 2004/0116571 A1 | 6/2004 | Su et al. | |
| 2004/0175875 A1 * | 9/2004 | Sung | 438/197 |
| 2004/0183232 A1 * | 9/2004 | Kinoshita et al. | 264/332 |
| 2004/0229035 A1 | 11/2004 | Sagal et al. | |
| 2004/0261988 A1 | 12/2004 | Sauciuc et al. | |
| 2004/0262372 A1 | 12/2004 | Houle et al. | |
| 2004/0262740 A1 | 12/2004 | Matayabas, Jr. et al. | |
| 2005/0016714 A1 | 1/2005 | Chung | |
| 2005/0027005 A1 | 2/2005 | Boldt | |
| 2005/0041406 A1 | 2/2005 | Matayabas, Jr. et al. | |
| 2005/0045372 A1 | 3/2005 | Hill et al. | |
| 2005/0046017 A1 | 3/2005 | Dangelo | |
| 2005/0049357 A1 | 3/2005 | Zhong et al. | |
| 2005/0151114 A1 * | 7/2005 | Davidson et al. | 252/73 |
| 2006/0167157 A1 | 7/2006 | Takahashi et al. | |

FOREIGN PATENT DOCUMENTS

| | | |
|---|---|---|
| EP | 0 991 120 A2 | 4/2000 |
| EP | 0 993 041 A2 | 4/2000 |
| EP | 1 189 275 A1 | 3/2002 |
| EP | 0 982 392 B1 | 9/2004 |
| JP | 2000-323631 | 11/2000 |
| JP | 2003-027080 | 1/2003 |
| JP | 2004-010880 | 1/2004 |
| JP | 2004-115747 | 4/2004 |
| WO | WO 2004/102660 A2 | 11/2004 |
| WO | WO 2004/114404 A1 | 12/2004 |
| WO | WO 2005/047378 A2 | 5/2005 |
| WO | WO 2005/066252 A2 | 7/2005 |

OTHER PUBLICATIONS

Liu et al., "Prediction of random packing limit for multimodal particle mixtures", Powder Technology, 126 (2002) 283-296.
Farris, "Prediction of the Viscosity of Multimodal Suspensions from Unimodal Viscosity Data", Transactions of the Society of Rheology, 12:2, 281-301 (1968).
Elliott et al., "Recursive packing of dense particle mixtures", Journal of Materials Science Letters, 21, 2002, 1249-1251.
Solbrekken et al., "The Development of a Tool to Predict Package Level Thermal Interface Material Performance", 2000 Inter Society Conference on Thermal Phenomena, 48-54.
Hill, "Thermal Conductivity of Platelet-filled Polymer-Ceramic Composites", Dissertation, Institut fur Struktur-und Funktionskeramik, Montanuniversitat Leoben, 2002.
Viswanath et al., "Thermal Performance Challenges from Silicon to Systems", Intel Technology Journal Q3, 2000, 1-16.

* cited by examiner

Primary Examiner—J. A. Lorengo
Assistant Examiner—Pegah Parvini
(74) Attorney, Agent, or Firm—Scott A. Bardell; James A. Baker

(57) ABSTRACT

The invention relates to thermally conductive greases that may contain carrier oil(s), dispersant(s), and thermally conductive particles, wherein the thermally conductive particles are a mixture of at least three distributions of thermally conductive particles, each of the at least three distributions of thermally conductive particles having an average ($D_{50}$) particle size which differs from the other average particle sizes by at least a factor of 5

22 Claims, No Drawings

THERMALLY CONDUCTIVE GREASE

CROSS REFERENCE TO RELATED APPLICATION

This application is a continuation-in-part of U.S. application Ser. No. 11/195,953, filed Aug. 3, 2005, the disclosure of which is incorporated by reference in its entirety herein.

BACKGROUND

The invention relates to thermal interface materials and their use.

In the computer industry, there is a continual movement to higher computing power and speed. Microprocessors are being made with smaller and smaller feature sizes to increase calculation speeds. Consequently, power flux is increased and more heat is generated per unit area of the microprocessor. As the heat output of the microprocessors increases, heat or "thermal management" becomes more of a challenge.

One aspect of thermal management is known in the industry as a "thermal interface material" or "TIM" whereby such a material is placed between a heat source, such as a microprocessor, and a heat dissipation device to facilitate the heat transfer. Such TIMs may be in the form of a grease or a sheet-like material. These thermal interface materials also are used to eliminate any insulating air between the microprocessor and heat dissipation device.

TIMs typically are used to thermally connect a heat source to a heat spreader, that is, a thermally conductive plate larger than the heat source, in which case they are referred to as TIM Is. TIMs may also be employed between a heat spreader and a thermal dissipation device such as a cooling device or a finned heat sink in which case such TIMs are referred to as TIM IIs. TIMs may be present in one or both locations in a particular installation. SUMMARY In one embodiment, the invention provides a thermally conductive grease that comprises 0 to about 49.5 weight percent of carrier oil, about 0.5 to about 25 weight percent of at least one dispersant, and at least about 50 weight percent of thermally conductive particles. The thermally conductive particles comprise a mixture of at least three distributions of thermally conductive particles, each of the at least three distributions of thermally conductive particles having an average ($D_{50}$) particle size which differs from the other distributions by at least a factor of 5.

In another embodiment, the invention provides a method of making a thermally conductive grease of the invention that comprises the steps of providing carrier oil, dispersant, and thermally conductive particles, and then mixing the carrier oil (if present), dispersant, and thermally conductive particles together.

In one aspect, the carrier oil (if present) and dispersant are mixed together, and the thermally conductive particles are mixed sequentially, finest to largest average particle size into the carrier oil and dispersant mixture. In another aspect, the thermally conductive particles are mixed together, and then mixed into the carrier oil (if present) and dispersant mixture. In another aspect, a portion or all of the thermally conductive particles are pre-dispersed with a dispersant prior to mixing the thermally conductive particles into the carrier oil (if present) and dispersant mixture.

In another embodiment, the invention provides a microelectronic package comprising a substrate, at least one microelectronic heat source attached to the substrate, and a thermally conductive grease disclosed in this application on the at least one microelectronic heat source.

In one aspect, the invention provides the above microelectronic package further comprising a heat spreader and thermally conductive grease disclosed in this application between the microelectronic heat source and the heat spreader.

In another aspect, the invention provides a microelectronic package comprising a substrate, at least one microelectronic heat source attached to the substrate, a heat spreader, and a heat dissipation device attached to the heat spreader wherein a thermally conductive grease disclosed in this application is between the heat spreader and the heat dissipation device.

In another aspect, the invention provides a microelectronic package comprising a substrate, at least one microelectronic heat source attached to the substrate, a heat spreader, a thermally conductive grease disclosed in this application between the microelectronic heat source and the heat spreader and a heat dissipation device wherein thermally conductive grease is between the heat spreader and the heat dissipation device.

DETAILED DESCRIPTION

As used herein:

"Grease" means a material having a viscosity of greater than $1\times10^4$ cps (10 Pa.s) at 1/s shear rate and 20° C. and a viscosity of less than $10^8$ cps at 1/sec shear rate and 125 C.

"Thermally conductive grease" means grease having a bulk conductivity of greater than 0.05 W/m-K as measured by the test method Bulk Thermal Conductivity described below.

All numbers are herein assumed to be modified by the term "about," unless stated otherwise. The recitation of numerical ranges by endpoints includes all numbers subsumed within that range (e.g., 1 to 5 includes 1, 1.5, 2, 2.75, 3, 3.80, 4, and 5).

Thermally conductive greases (TCGs) of the invention may contain one or more carrier oils. Carrier oil provides the base or matrix for the TCGs of the invention. Useful carrier oils may comprise synthetic oils or mineral oils, or a combination thereof and are typically flowable at ambient temperature. Specific examples of useful carrier oils include polyol esters, epoxides, silicone oils, and polyolefins or a combination thereof.

Commercially available carrier oils include HATCOL 1106, a polyol ester of dipentaerythritol and short chain fatty acids, and HATCOL 3371, a complexed polyol ester of trimethylol propane, adipic acid, caprylic acid, and capric acid (both available form Hatco Corporation, Fords, N.J.); and HELOXY 71 an aliphatic epoxy ester resin, available from Hexion Specialty Chemicals, Inc., Houston Tex.

Carrier oil may be present in the TCGs of the invention in an amount of from 0 to about 49.5 weight percent, and in other embodiments, from 0 to not more than about 20 or about 12 weight percent of the total composition. In other embodiments, carrier oil may be present in an amount of at least 2, 1, or 0.5 weight percent of the composition. Carrier oil may also be present in the TCGs of the invention in ranges including from about 0.5, 1, or 2 to about 12, 15, or 20 weight percent.

TCGs of the invention contain one or more dispersants. The dispersant(s) may be present in combination with carrier oil, or may be present in the absence of carrier oil. The dispersants improve the dispersion of the thermally conductive particles (described below) in the carrier oil if present. Useful dispersants may be characterized as polymeric or ionic in nature. Ionic dispersants may be anionic or cationic. In some embodiments, the dispersant may be nonionic. Combinations of dispersants may be used, such as, the combination of an ionic and a polymeric dispersant.

Examples of useful dispersants include, but not limited to, polyamines, sulfonates, modified polycaprolactones, organic phosphate esters, fatty acids, salts of fatty acids, polyethers, polyesters, and polyols, and inorganic dispersants such as surface-modified inorganic nanoparticles, or any combination thereof.

Commercially available dispersants include those having the tradenames SOLSPERSE 24000 and SOLSPERSE 39000 hyperdispersants, available from Noveon, Inc., a subsidiary of Lubrizol Corporation, Cleveland, Ohio; EFKA 4046, a modified polyurethane dispersant, available from Efka Additives BV, Heerenveen, The Netherlands; and RHODAFAC RE-610, an organic phosphate ester, available from Rhone-Poulenc, Plains Road, Granbury, N.J.

Dispersant is present in the TCGs of the invention in an amount of at least 0.5 and not more than 50 weight percent, and in other embodiments, not more than 25, 10, or 5 weight percent of the total composition. In another embodiment, dispersant may be present in an amount of at least 1 weight percent. Dispersant may also be present in the TCGs of the invention in ranges including from about 1 to about 5 weight percent.

TCGs of the invention contain thermally conductive particles. Useful thermally conductive particles include, but are not limited to, those made from or that comprise diamond, polycrystalline diamond, silicon carbide, alumina, boron nitride (hexagonal or cubic), boron carbide, silica, graphite, amorphous carbon, aluminum nitride, aluminum, zinc oxide, nickel, tungsten, silver, and combinations of any of them. Each of these particles are of a different type.

The thermally conductive particles used in the TCGs of the invention are a mixture of at least three distributions of thermally conductive particles. Each of the at least three distributions of thermally conductive particles have an average particle size which differs from the average particle size of the distribution above and/or below it by at least a factor of 5, and in other embodiments, at least a factor of 7.5, or at least a factor of 10, or greater than 10. For example, a mixture of thermally conductive particles may consist of: a smallest particle distribution having an average particle diameter ($D_{50}$) of 0.3 micrometers; a middle distribution having an average particle diameter ($D_{50}$) of 3.0 micrometers; and a largest distribution having an average particle diameter ($D_{50}$) of 30 micrometers. Another example may have average diameter particle distributions having average particle diameter ($D_{50}$) values of 0.03 micrometers, 0.3 micrometers, and 3 micrometers.

The thermally conductive particles used in the TCGs of the invention are a mixture of at least three distributions of thermally conductive particles resulting in at least a trimodal distribution. In such a trimodal distribution, the minima between the peaks (distance between the baseline of the peaks and the lowest point of the valley between distribution peaks) may be no more than 75, 50, 20, 10 or 5 percent of the interpolated value (height) between adjacent peaks. In some embodiments, the three size distributions are essentially non-overlapping. "Essentially non-overlapping" means that the lowest point of the valley is no more than 5% of the interpolated value between adjacent peaks. In other embodiments, the three distributions have only a minimal overlap. "Minimal overlap" means that the lowest point of the valley is no more than 20% of the interpolated value between adjacent peaks.

Typically, for a trimodal TCG, the average particle size for the smallest average diameter may range from about 0.02 to about 5.0 micrometers. Typically, the average particle size for the middle average diameter may range from about 0.10 to about 50.0 micrometers. Typically, the average particle size for the largest average diameter may range from about 0.5 to about 500 micrometers.

In some embodiments, it is desirable to provide a TCG having the maximum possible volume fraction thermally conductive particles that is consistent with the desirable physical properties of the resulting TCG, for example, that the TCG conform to the surfaces with which it is in contact and that the TCG be sufficiently flowable to allow easy application.

With this in mind, the conductive particle distributions may be selected in accordance with the following general principles. The distribution of smallest diameter particles should have diameters that are smaller than, or nearly bridge, the expected gap between the two substrates to be thermally connected. Indeed, the largest particles may bridge the smallest gap between substrates. When the particles of the largest diameter distribution are in contact with each other, a gap or void volume between the particles will remain. The mean diameter of the middle diameter distribution may be advantageously selected to just fit within the gap or void between the larger particles. The insertion of the middle diameter distribution will create a population of smaller gaps or voids between the particles of the largest diameter distribution and the particles of the middle diameter distribution the dimensions of which may be used to select the mean diameter of the smallest distribution. In a similar fashion, desirable mean particle dimensions may be selected for fourth, fifth, or higher order populations of particles if desired.

Each distribution of thermally conductive particles may comprise the same or different thermally conductive particles in each or any of the at least three distributions. Additionally, each distribution of thermally conductive particles may contain a mixture of different types of thermally conductive particles The remaining voids may be thought of as being filled with carrier, dispersant(s) and other components with a slight excess to provide flowability. Further guidance in the selection of suitable particle distributions may be found in "Recursive Packing of Dense Particle Mixtures", Journal of Materials Science Letters, 21, (2002), pages 1249-1251. From the foregoing discussion, it will be seen that the mean diameters of the successive particle size distributions will preferably be quite distinct and well separated to ensure that they will fit within the interstices left by the previously packed particles without significantly disturbing the packing of the previously packed particles.

The thermally conductive particles may be present in the TCGs of the invention in an amount of at least 50 percent by weight. In other embodiments, thermally conductive particles may be present in amounts of at least 70, 75, 80, 85, 86, 87, 88, 89, 90, 91, 92, 93, 94, 95, 96, 97, or 98 weight percent. In other embodiments, thermally conductive particles may be present in the TCGs of the invention in an amount of not more than 99, 98, 97, 96, 95, 94, 93, 92, 91, 90, 89, 88, 87, 86, or 85 weight percent.

The TCGs and TCG compositions of the invention may also optionally include additives such as antiloading agents, antioxidants, leveling agents and solvents (to reduce application viscosity), for example, methylethyl ketone (MEK), methylisobutyl ketone, and esters such as butyl acetate.

The TCGs of the invention are generally made by blending dispersant and carrier oil together, and then blending the thermally conductive particles sequentially, finest to largest average particle size into the dispersant/carrier oil mixture. The thermally conductive particles may also be premixed with one another, and then added to the liquid components. Heat may be added to the mixture in order to reduce the overall viscosity and aid in reaching a uniformly dispersed mixture. In some embodiments, it may be desirable to first pretreat or pre-disperse a portion or all of the thermally conductive particles with dispersant prior to mixing the particles into the dispersant/carrier mixture.

The TCGs of the invention may be used in microelectronic packages and may be used to assist in the dissipation of heat from a heat source, for example, a microelectronic die or chip to a thermal dissipation device. Microelectronic packages may comprise at least one heat source, for example, a die mounted on a substrate or stacked die on a substrate, a thermally conductive grease of the invention on the heat source, and may include an additional thermal dissipation device in thermal and physical contact with the die, such as, for example, a thermal spreader. A thermal spreader may also be a heat source for any subsequent thermal dissipation device. The thermally conductive greases of the invention are useful to provide thermal contact between said die and thermal dissipation device. Additionally, TCGs of the invention may also be used in thermal and physical contact between a thermal dissipation device and a cooling device. In another embodiment, the TCGs of the invention may be used between a heat generating device and a cooling device, that is, without using a heat or thermal spreader in between. TCGs of the invention are useful in TIM I and TIM II applications.

EXAMPLES

Bulk Thermal Conductivity

Bulk thermal conductivity was measured generally in accord with ASTM D-5470-01 on the TCG samples using a Heat Transfer Tester, available from Custom Automation, Inc., Blaine, Minn. The Heat Transfer Tester was built according to Proposal Number 3M-102204-01 and included such features as: a vision system capable of measuring parallelism and gap between copper meter bars for up to 0.010 inch (0.254 mm) gaps, copper meter bars with 5 resistance temperature detector (RTD) sensors on each meter bar, a cooler to cool the cooled clamping block (to hold the cooled meter bar) having an operating range of from −20 to 100° C. and can hold the coolant temperature to +/−0.02° C., a 25 lbF load cell mounted on a X-Y micrometer adjust positioning stage, a cooled clamping block (to hold the cooled meter bar) mounted on the load cell, a heated clamping block (to hold the heated meter bar) using resistive heating and has its temperature controlled by a controller and thermocouple, the ability to add weights above the heated clamping block to adjust the contact force on the meter bars from 5 to 50 N, and means to measure and record temperature, meter bar gap, and contact force at time intervals to a spreadsheet.

The vision system used to measure meter bar gap was calibrated as outlined in the operating procedures provided. The cooler was charged with a 50/50 blend of water and ethylene glycol. The gap between the copper meter bars was set at about 550 micrometers at room temperature. The heater set point was put at 120° C. and the cooler set point at −5° C., and the unit was allowed to equilibrate. The meter bar gap after equilibration was about 400 micrometers. The surfaces of the hot and cold meter bars were planarized using the individual meter bar tumbuckles until the gap between the meter bars read by each of the three individual cameras fell within a +/−3 µm range.

An excess of each TCG sample tested was placed on the hot meter bar surface and smoothed across the entire face. The head was then closed and clamped into place, causing excess TCG sample to ooze out of the meter bar gap. This excess was removed with a paper towel or a fine cloth and the pins of the meter bars were cleaned to facilitate accurate measurement of the gap by the three vision cameras. The instrument was allowed to equilibrate for about 10 minutes as data was continuously recorded. The meter bar gap was lowered about 100 µm and excess TCG sample oozed out of the gap and was cleaned. The instrument was again allowed to equilibrate for about 10 minutes as data was continuously recorded. This sequence of lowering the meter bar gap in about 100 µm increments, cleaning, and recording data was repeated until a final reading was taken, typically at a meter bar gap of <100 µm. The meter bars were opened back up to about a 400 µm gap, cleaned, and the procedure was repeated for the next sample.

The data were recorded every 7-8 seconds by the instrument and contained a time/date stamp, the sample name, the force exerted on the TCG in the meter bar gap, each of the individual meter bar gap readings, and each of the 10 RTD sensor temperature readings. The file was downloaded into a spreadsheet for analysis. In the analysis, the last 10 data points recorded at the given gap were averaged, and these averages were used for the calculations.

The power flowing through the TCG sample was calculated using the known bulk conductivity of copper, the dimensions of the copper bars, and the locations of the RTD temperature sensors. Typically, the calculations indicated slightly different wattage flowing down the hot meter bar than down the cold meter bar; these two values were averaged for calculations extending to the TCG sample. The temperature at the surface of each of the meter bars was also extrapolated from a plot of the temperatures and the RTD sensor locations.

The power, the average of the three individual meter bar gaps, the temperature drop across the meter bar gap, and the cross sectional area of the hot/cold meter bars were then used to calculate the temperature gradient, the power flux, and then the thermal impedance for the TCG sample under those conditions.

These calculations were completed for each of the meter bar gaps at which the TCG sample had been tested, and the resulting thermal impedance and average gap data was plotted. A line was fitted to the data using spreadsheet software, and the bulk conductivity was calculated as the inverse of the lines' slope. The y-axis intercept and the slope were then used to calculate the thermal impedance at a 100 µm meter bar gap.

Viscosity

The viscosity data on selected samples was generated on a Rheometrics RDA3 viscometer (TA Instruments, Newcastle, Del.). The viscometer was run with disposable 1 inch (25.4 mm) diameter parallel plates in the log sweep mode starting at 0.5/sec initial shear rate, taking 5 points/decade up to 1000/sec shear rate. The gap was set at 0.5 mm for a run, and then lowered to 0.25 mm for a second run on some samples; on other samples the gap was set and run only at 0.25 mm. Temperatures of the runs were controlled to either 125° C. or 25° C. as indicated in the table below. Viscosities were recorded in mPa.s at a 1.25/sec shear rate.

Milling Procedure

Roughly 40 cc of 0.5 mm diameter yttria-stabilized zirconia beads (available from Tosoh, Hudson, Ohio or from Toray Ceramics, George Missbach & Co., Atlanta, Ga.) were put into the basket of a Hockmeyer HM-1/16 Micro Mill ("Hockmeyer mill") (Hockmeyer Equipment Corp., Harrison, N.J.). The desired MEK and dispersant (SOLSPERSE) were added to the mill chamber and stirred with an air mixer for at least 4 minutes so as to dissolve the dispersant in the solvent. The diamond particles were weighed into the chamber and the contents were stirred for an additional minute to wet out the diamond particles. The resulting mixture was then milled at the maximum speed of the Hockmeyer that avoided splashing. The resulting slurry was poured into a polyethylene container and the solvent was allowed to evaporate until it could not be detected by odor. Details of the compositions milled are shown below.

| Diamond Particle Size ($D_{50}$) (micrometer) | Mill Time (min) | Mill Charges | | |
|---|---|---|---|---|
| | | Methyl Ethyl Ketone (g) | SOLSPERSE 24000 (g) | Diamond Particles (g) |
| 0.25 | 20 | 280 | 54 | 900 |
| 0.50 | 15 | 280 | 27 | 900 |
| 1.00 | 10 | 255 | 16.5 | 1100 |

Glossary

| Name | Description | Source |
|---|---|---|
| BYK 361 | Polyacrylate copolymer leveling agent | BYK-Chemie USA, Wallingford, CT |
| 2,2' Bypyridylethylene bis-salicylimine | A chelating agent | Alfa Aesar, Ward Hill, MA |
| DP 1 | Diamond particles having a $D_{50}$ of 0.25 μm and a $D_{50}$ of 0.50 μm | Tomei Diamond, Englewood Cliffs, NJ |
| DP 2 | Diamond particles having a $D_{50}$ of other than 0.25 or 0.50 μm | National Diamond Research Company, Chesterfield, MI |
| Ethylene bis-salycimine | A chelating agent | Strem Chemicals, Newburyport, MA |
| F180 SiC | Silicon carbide particles having a $D_{50}$ particle size of 80 μm | Washington Mills Electro Mineral Corp., Niagara Falls, NY |
| GAFAC RE 610 (now RHODAFAC RE-610) | An ionic dispersant | Rhone-Poulenc, Granbury, NJ |
| G Dia. (1.5) G Dia. (3.0) G Dia. (30) | Diamonds, 1.5, 3.0, and 30 μm diameter respectively | Diamond Innovation, Worthington, OH |
| H Dia. (0.25) H Dia. (2-3) H Dia. (20-30) | Diamonds, 0.25, 2-3, and 20-30 μm diameter respectively | Henan Hengxiang Diamond Abrasive Company, Zhengzhou, PR China |
| GC 20000 | Silicon carbide particles having a $D_{50}$ of 0.3 μm | Fujimi Corporation, Nagoya, JP |
| GC 8000 | Silicon carbide particles having a $D_{50}$ of 1.0 μm | Fujimi Corporation |
| GC 6000 | Silicon carbide particles having a $D_{50}$ of 2.0 μm | Fujimi Corporation |
| GC 4000 | Silicon carbide particles having a $D_{50}$ of 3.0 μm | Fujimi Corporation |
| GC 2000 | Silicon carbide particles having a $D_{50}$ of 9 μm | Fujimi Corporation |
| GC 1200 | Silicon carbide particles having a $D_{50}$ of 13.5 μm | Fujimi Corporation |
| GC 700 | Silicon carbide particles having a $D_{50}$ of 18 μm | Fujimi Corporation |
| GC 600 | Silicon carbide particles having a $D_{50}$ of 20 μm | Fujimi Corporation |
| GC 400 | Silicon carbide particles having a $D_{50}$ of 35 μm | Fujimi Corporation |
| GC F320 | Silicon carbide particles having a $D_{50}$ of 29 μm | Fujimi Corporation |
| HATCOL 1106 | A polyol ester of dipentaerythritol and short chain fatty acids (carrier oil) | HATCOL Corporation, Fords, NJ |
| HATCOL 2300 | A complexed polyol ester or pentaerythritols and short chain fatty acids (carrier oil) | HATCOL Corporation |
| HATCOL 2930 | A diester of trimellitic anhydride and isodecyl alcohol (carrier oil) | HATCOL Corporation |
| HATCOL 2949 | A diester of dimer acid and 2-ethyhexyl alcohol (carrier oil) | HATCOL Corporation |
| HATCOL 2999 | A polyol ester or pentaerythritol and short chain fatty acids (carrier oil) | HATCOL Corporation |
| HATCOL 3165 | A polyol ester of dipentaerythritol and short chain fatty acids (carrier oil) | HATCOL Corporation |
| HATCOL 3371 | A complexed polyol ester of trimethylol propane, adipic acid, caprylic acid, and capric acid (carrier oil) | HATCOL Corporation |
| HATCOL 5150 | A polyol ester of dipentaerythritol and short chain fatty acids (carrier oil) | HATCOL Corporation |
| HELOXY 71 | An aliphatic epoxy ester resin (carrier oil) | Hexion Specialty Chemicals, Inc., Houston, TX |
| HELOXY 505 | An aliphatic epoxy ester resin (carrier oil) | Hexion Specialty Chemicals, Inc. |
| IRGANOX 1010 | Antioxidant | Ciba Specialty Chemicals, Tarrytown, NY |
| KADOX 911 (0.1) KADOX 930 (0.3) | Zinc Oxide, 0.1 and 0.3 μm diameter respectively | Horsehead Corporation, Monaca, PA |
| Lithium Stearate | A fatty acid salt (ionic dispersant) | Baerlocher USA, Cincinnati, OH |
| Nickel (<5) Nickel(−400 Mesh) | Spherical nickel powder, <5 μm diameter, and nickel powder, <35 μm diameter respectively. | Novamet, Wykoff, New Jersey |
| OX-50 (0.04) | Silica, 40 nanometers diameter | Degussa Corporation, Parsippany, NJ |
| PEG Distearate | Poly(ethylene glycol) distearate having a number average molecular weight of about 930 (carrier oil/polymeric dispersant) | Aldrich Chemical Co., Milwaukee, WI |
| RHODAFAC RE610 | A polymeric dispersant | Rhone-Poulenc, Granbury, NJ |
| SOLPLUS 520 | A polymeric dispersant | Noveon, Inc., a subsidiary of Lubrizol Corporation, Cleveland, OH |
| SOLSPERSE 16000 | A polymeric dispersant | Noveon, Inc. subsidiary of Lubrizol Corporation, Cleveland, OH |
| SOLSPERSE 24000 | A polymeric dispersant | Noveon, Inc. |
| SOLSPERSE 39000 | A polymeric dispersant | Noveon, Inc. |
| Sph. Al (3.0-4.5) Sph. Al (17-30) | Spherical aluminum powder, 3.0-4.5 and 17-30 μm diameter respectively | Alfa Corp., Ward Hill, MA |
| T Dia. (0.25) | 0.25 μm diameter diamonds | Tomei Corporation of America, Englewood Cliffs, NJ |
| TONE 305 | A polyol resulting from the addition reaction of caprolactone with trimethylol propane (carrier oil) | The Dow Chemical Company, Midland, MI |

-continued

| Name | Description | Source |
|---|---|---|
| Tungsten (1-5) Tungsten (−325 Mesh) | Tungsten powder, 1-5 and <50 μm diameter respectively. | Alfa Corp., Ward Hill, Massachusetts |
| WA 30000 | Aluminum oxide particles having a $D_{50}$ of 0.25 μm | Fujimi Corporation |
| WA6000 (2.0) | Alumina grains, 2.0 μm diameter | Fujimi Corporation, Nagoya, Japan |
| WA 4000 | Aluminum oxide particles having a $D_{50}$ of 3.0 μm | Fujimi Corporation |
| WA 500 | Aluminum oxide particles having a $D_{50}$ of 30 μm | Fujimi Corporation |

"Sulfonated Bis(pentane dicaprolactone)", an ionic dispersant, was prepared as follows: To a reactor equipped with a mechanical stirrer, and vacuum was added 25 grams (0.476 equivalents) 1,5-pentane diol from Aldrich Chemical Co., Milwaukee, Wis., 54.3 grams (0.476 equivalents) caprolactone from Aldrich Chemical Co., and 8.0 grams (0.054 equivalents) dimethyl-5-sodiosulfoisophthalate available from DuPont Chemicals, Wilmington, Del. The reactor contents were stirred and heated to 170° C. with a vacuum at 115 mm mercury. The reaction was complete after 4 hours and a sample was analyzed by infrared spectroscopy. The final product was a clear, low viscosity liquid with a theoretical sulfonate equivalent weight of 1342.

"iC8 Modified silica nanoparticles", a nonionic, inorganic dispersant, was prepared as follows: 61.42 grams BS1316 isooctyltrimethoxysilane (Wacker Silicones Corp., Adrian, Mich.), 1940 grams 1-methoxy-2-propanol and 1000 grams NALCO 2326 colloidal silica were combined in a 1 gallon glass jar. The mixture was shaken to ensure mixing and then placed in an oven at 80° C. overnight. The mixture was then dried in a flow through oven at 150° C. to produce a white particulate solid. "HIMOD", a sulfonated polyol ionic dispersant, was prepared as follows: A reactor equipped with a mechanical stirrer, nitrogen purge, and distillation apparatus was charged with dimethyl-5-sodiosulfoisophthalate (42.6 grams, 0.144 moles, available from DuPont Chemicals, Wilmington, Del.), polyethylene glycol having a molecular weight of 400 (115.1 grams, 0.288 moles, available from Union Carbide Chemical and Plastics Co., Inc. (now The Dow Chemical Company, Midland, Mich.)), and polypropylene glycol having a molecular weight of 425 (122.3 grams, 0.288 moles, available from Aldrich Chemical Co., Milwaukee, Wis.), and xylene (75 grams). The reactor was slowly heated to 220° C. for about 1 hour to remove the xylene. Zinc acetate (0.2 gram) was then added to the reactor and the temperature was held at 220° C. for 4 hours with concomitant distillation of methanol from the reaction. The temperature was reduced to about 160° C. and 0.2 Torr (SI) vacuum was applied to the resulting mixture for 30 minutes. The contents were cooled to 120° C. under nitrogen to yield a clear, colorless polyol. The OH equivalent was determined to be 310 g/mole OH and the theoretical sulfonated equivalent weight was found to be 1882 grams polymer/mole sulfonated.

"TCPA HATCOL 3371", an ionic dispersant was prepared as follows: To a reactor equipped with a mechanical stirrer, and nitrogen purge was added 45 grams (0.0241 equivalents) HATCOL 3371 and 3.4 grams (0.0121 equivalents) tetrachlorophthalic anhydride. The reactor contents were stirred and heated to 150° C. with a constant nitrogen purge. The reaction was complete after 4 hours and a sample was analyzed by infrared spectroscopy. The final product was a brown, low viscosity liquid with a theoretical acid equivalent weight of 18,127.

"TONE 305 TCPA", an ionic dispersant, was prepared as follows: To a reactor equipped with a mechanical stirrer, and nitrogen purge was added 10 grams (0.1 equivalents) Tone 305 from Dow Chemical Company, and 1.0 grams (0.00355 equivalents) tetrachlorophthalic anhydride from Aldrich Chemical. The reactor contents were stirred and heated to 105° C. with a constant nitrogen purge. The reaction was complete after 4 hours and a sample was analyzed by infrared spectroscopy. The final product was a clear, low viscosity liquid with a theoretical acid equivalent weight of 3,100.

Sample Preparation

Except as noted in specific Examples, dispersant or mixture of dispersants was weighed into a watch glass. Any other surface active ingredients, if present, were also weighed onto the watch glass. Carrier oil(s), if present, was added to the dispersant(s) and the mixture was stirred with a metal spatula until the dispersant(s) was fully mixed into the carrier oil. Thermally conductive particles were added to the dispersant(s)/carrier oil mixture sequentially, starting with the smallest particle size distribution. Each of the thermally conductive particle distributions was dispersed into the dispersant(s)/carrier oil mixture with a metal spatula before adding the next distribution of thermally conductive particles. If necessary, the thermally conductive grease composition was heated in an oven (110° C.) to reduce the viscosity of the composition to facilitate mixing of the thermally conductive particles and/or subsequent additions of thermally conductive particles. The resultant thermally conductive greases were transferred into and stored in capped glass vials.

In cases where the thermally conductive particles were pre-dispersed, the amount of dispersant to be carried on the fine thermally conductive particle distribution was calculated. The amount of remaining dispersant necessary for the formulation was then determined and was weighed on to a watch glass. The remaining steps are identical to those described above.

Examples 1-64

The compositions of Examples 1-64 are shown in TABLE 1. The compositions of Examples A-N and 65-74 are shown in TABLE 2. TABLE 3 shows data resulting from the measurement of bulk conductivity and thermal impedance for selected Examples. TABLE 4 shows viscosity data for selected Examples.

TABLE 1

| Example | Carrier Oil (g) | Dispersant (g) | Disperant (g) | Particle (g) ($D_{50}$, μm) | Particle (g) ($D_{50}$, μm) | Particle (g) ($D_{50}$, μm) |
|---|---|---|---|---|---|---|
| Example 1 | HATCOL 1106 (0.32); HATCOL 3371 (0.32) | SOLSPERSE 39000 (0.36) | — | GC 20000 (2.12) (0.3) | GC 4000 (2.97) (3.0) | GC 400 (3.92) (35) |

TABLE 1-continued

| Example | Carrier Oil (g) | Dispersant (g) | Disperant (g) | Particle (g) (D$_{50}$, μm) | Particle (g) (D$_{50}$, μm) | Particle (g) (D$_{50}$, μm) |
| --- | --- | --- | --- | --- | --- | --- |
| Example 2 | HATCOL 1106 (0.37); HATCOL 3371 (0.37) | SOLSPERSE 39000 (0.36) | — | GC 20000 (2.08) (0.3) | GC 4000 (2.97) (3.0) | GC 400 (3.88) (35) |
| Example 3 | HATCOL 1106 (0.42); HATCOL 3371 (0.42) | SOLSPERSE 39000 (0.35) | — | GC 20000 (2.07) (0.3) | GC 4000 (2.91) (3.0) | GC 400 (3.84) (35) |
| Example 4 | HATCOL 3371 (1.60) | SOLSPERSE 39000 (0.90) | — | GC 20000 (5.28) (0.3) | GC 4000 (7.40) (3.0) | GC 400 (9.81) (35) |
| Example 5 | HATCOL 3371 (0.74) | SOLSPERSE 39000 (0.36) | — | GC 20000 (2.08) (0.3) | GC 4000 (2.93) (3.0) | GC 400 (3.89) (35) |
| Example 6 | HATCOL 3371 (0.85) | SOLSPERSE 39000 (0.35) | — | GC 20000 (2.07) (0.3) | GC 4000 (2.90) (3.0) | GC 400 (3.82) (35) |
| Example 7 | — | SOLSPERSE 39000 (1.10) | — | GC 20000 (2.09) (0.3) | GC 4000 (2.93) (3.0) | GC 400 (3.90) (35) |
| Example 8 | HATCOL 1106 (0.37); HATCOL 3371 (0.37) | SOLSPERSE 39000 (0.27) | GAFAC RE 610 (0.09) | GC 20000 (2.10) (0.3) | GC 4000 (2.93) (3.0) | GC 400 (3.89) (35) |
| Example 9 | HATCOL 1106 (0.37); HATCOL 3371 (0.37) | SOLSPERSE 39000 (0.27) | HIMOD (0.09) | GC 20000 (2.09) (0.3) | GC 4000 (2.94) (3.0) | GC 400 (3.88) (35) |
| Example 10 | HATCOL 3371 (0.75) | SOLSPERSE 39000 (0.18) | GAFAC RE 610 (0.18) | GC 20000 (2.10) (0.3) | GC 4000 (2.92) (3.0) | GC 400 (3.87) (35) |
| Example 11 | HATCOL 3371 (0.74) | SOLSPERSE 39000 (0.27) | GAFAC RE 610 (0.09) | GC 20000 (2.09) (0.3) | GC 4000 (2.92) (3.0) | GC 400 (3.89) (35) |
| Example 12 | HATCOL 3371 (0.57) | SOLSPERSE 39000 (0.27) | TCPA HATCOL 3371 (0.27) | GC 20000 (2.09) (0.3) | GC 4000 (2.94) (3.0) | GC 400 (3.90) (35) |
| Example 13 | HATCOL 1106 (0.37); HATCOL 3371 (0.37) | SOLSPERSE 39000 (0.27) | Lithium Stearate (0.09) | GC 20000 (2.08) (0.3) | GC 4000 (2.93) (3.0) | GC 400 (3.89) (35) |
| Example 14 | HATCOL 3371 (0.15) | SOLSPERSE 39000 (0.08) | 2,2' Bypyridylethylene bis-salicylimine (0.02) | GC 20000 (0.50) (0.3) | GC 4000 (0.70) (3.0) | GC 400 (0.93) (35) |
| Example 15 | HATCOL 3371 (0.15) | SOLSPERSE 39000 (0.08) | Ethylene bis-salycimine (0.02) | GC 20000 (0.49) (0.3) | GC 4000 (0.69) (3.0) | GC 400 (0.92) (35) |
| Example 16 | HATCOL 3371 (0.16) | SOLSPERSE 39000 (0.09) | BYK 361 (0.03) | GC 20000 (0.53) (0.3) | GC 4000 (0.74) (3.0) | GC 400 (0.98) (35) |
| Example 17 | HELOXY 71 (0.83) | SOLSPERSE 39000 (0.27) | — | GC 20000 (2.10) (0.3) | GC 4000 (2.92) (3.0) | GC 400 (3.87) (35) |

TABLE 1-continued

| Example | Carrier Oil (g) | Dispersant (g) | Disperant (g) | Particle (g) ($D_{50}$, μm) | Particle (g) ($D_{50}$, μm) | Particle (g) ($D_{50}$, μm) |
|---|---|---|---|---|---|---|
| Example 18 | HELOXY 71 (0.94) | SOLSPERSE 39000 (0.26) | — | WA 30000 (2.09) (0.25) | WA 4000 (3.00) (3.0) | WA 500 (3.83) (30) |
| Example 19 | HATCOL 3371 (0.94) | SOLSPERSE 39000 (0.26) | — | WA 30000 (2.07) (0.25) | WA 4000 (2.90) (3.0) | WA 500 (3.83) (30) |
| Example 20 | TONE 305 (0.85) | SOLSPERSE 39000 (0.35) | — | GC 20000 (2.07) (0.3) | GC 4000 (2.90) (3.0) | GC 400 (3.83) (35) |
| Example 21 | TONE 305 (0.75) | SOLSPERSE 39000 (0.27) | Sulfonated Bis(pentane dicaprolactone) (0.09) | GC 20000 (2.09) (0.3) | GC 4000 (2.94) (3.0) | GC 400 (3.88) (35) |
| Example 22 | TONE 305 (0.85) | SOLSPERSE 39000 (0.26) | TCPA modified TONE 305 (0.09) | GC 20000 (2.07) (0.3) | GC 4000 (2.90) (3.0) | GC 400 (3.83) (35) |
| Example 23 | TONE 305 (0.85) | SOLSPERSE 39000 (0.26) | GAFAC RE 610 (0.09) | GC 20000 (2.07) (0.3) | GC 4000 (2.91) (3.0) | GC 400 (3.85) (35) |
| Example 24 | TONE 305 (0.75) | SOLSPERSE 39000 (0.36) | — | GC 20000 (2.08) (0.3) | GC 4000 (2.93) (3.0) | GC 400 (3.88) (35) |
| Example 25 | HATCOL 3371 (0.74) | SOLSPERSE 39000 (0.27) | GAFAC RE 610 (0.09) | GC 20000 (2.09) (0.3) | GC 4000 (2.94) (3.0) | GC 400 (3.90) (35) |
| Example 26 | HATCOL 3371 (0.74) | SOLSPERSE 39000 (0.27) | GAFAC RE 610 (0.09) | GC 20000 (2.09) (0.3) | GC 4000 (2.92) (3.0) | GC 400 (3.89) (35) |
| Example 27 | HATCOL 3371 (0.74) | SOLSPERSE 39000 (0.27) | GAFAC RE 610 (0.09) | GC 20000 (2.09) (0.3) | GC 4000 (2.93) (3.0) | GC 400 (3.88) (35) |
| Example 28 | HATCOL 3371 (0.74) | SOLSPERSE 39000 (0.27) | Sulfonated pentanediolcaprolactone (0.09) | GC 20000 (2.09) (0.3) | GC 4000 (2.93) (3.0) | GC 400 (3.89) (35) |
| Example 29 | HATCOL 3371 (0.74) | SOLSPERSE 39000 (0.36) | — | GC 20000 (2.09) (0.3) | GC 2000 (2.93) (9.0) | F180 SiC (3.88) (80) |
| Example 30 | HATCOL 1106 (0.74) | SOLSPERSE 39000 (0.36) | — | GC 20000 (2.10) (0.3) | GC 2000 (2.93) (9.0) | F180 SiC (3.89) (80) |
| Example 31 | HATCOL 3371 (0.74) | SOLSPERSE 39000 (0.36) | — | GC 20000 (2.09) (0.3) | GC 2000 (2.94) (9.0) | F180 SiC (3.88) (80) |
| Example 32 | HATCOL 3371 (0.74) | SOLSPERSE 39000 (0.27) | GAFAC RE 610 (0.09) | GC 20000 (2.09) (0.3) | GC 1200 (2.93) (13.5) | F180 SiC (3.89) (80) |
| Example 33 | HATCOL 3371 (0.74) | SOLSPERSE 39000 (0.27) | PEG Distearate (0.09) | GC 20000 (2.10) (0.3) | GC 2000 (2.93) (9.0) | F180 SiC (3.88) (80) |
| Example 34 | HATCOL 3371 (0.74) | SOLSPERSE 39000 (0.36) | iC8 Modified silica nanoparticles (0.01) | GC 20000 (2.09) (0.3) | GC 2000 (2.93) (9.0) | F180 SiC (3.89) (80) |
| Example 35 | HATCOL 1106 (0.74) | SOLSPERSE 39000 (0.28) | GAFAC RE 610 (0.09) | GC 20000 (2.09) (0.3) | GC 2000 (2.93) (9.0) | F180 SiC (3.88) (80) |
| Example 36 | — | SOLSPERSE 39000 (0.80) | — | DP 1 (2.16) (0.25) | DP 2 (3.03) (3.0) | DP 2 (4.04) (30) |

TABLE 1-continued

| Example | Carrier Oil (g) | Dispersant (g) | Disperant (g) | Particle (g) (D$_{50}$, μm) | Particle (g) (D$_{50}$, μm) | Particle (g) (D$_{50}$, μm) |
|---|---|---|---|---|---|---|
| Example 37 | HATCOL 2300 (0.25) | SOLSPERSE 39000 (0.55) | — | DP 1 (2.19) (0.25) | DP 2 (3.03) (3.0) | DP 2 (4.02) (30) |
| Example 38 | HATCOL 2300 (0.52) | SOLSPERSE 39000 (0.28) | — | DP 1 (2.14) (0.25) | DP 2 (3.03) (3.0) | DP 2 (4.03) (30) |
| Example 39 | HATCOL 2930 (0.52) | SOLSPERSE 39000 (0.28) | — | DP 1 (2.18) (0.25) | DP 2 (3.05) (3.0) | DP 2 (4.02) (30) |
| Example 40 | HATCOL 3165 (0.52) | SOLSPERSE 39000 (0.28) | — | DP 1 (2.15) (0.25) | DP 2 (3.04) (3.0) | DP 2 (4.02) (30) |
| Example 41 | HATCOL 3371 (0.52) | SOLSPERSE 39000 (0.28) | — | DP 1 (2.18) (0.25) | DP 2 (3.04) (3.0) | DP 2 (4.02) (30) |
| Example 42 | HATCOL 3371 (0.83) | SOLSPERSE 39000 (0.27) | — | GC 20000 (2.09) | GC 4000 (2.92) | GC 400 (3.89) |
| Example 43 | HELOXY 71 (0.74) | SOLSPERSE 39000 (0.36) | — | DP 1 (2.10) (0.25) | DP 2 (2.93) (6.0) | DP 2 (3.89) (60) |
| Example 44 (1) | HELOXY 71 (0.52) | SOLSPERSE 39000 (0.28) | — | DP 2 (0.83) (0.1) | DP 2 (1.43) (1.0) | DP 2 (2.53) (9.0) |
| Example 45 | HELOXY 71 (1.08) | SOLSPERSE 39000 (0.92) | — | DP 1 (5.40) (0.25) | DP 2 (7.58) (6.0) | DP 2 (10.0) (60) |
| Example 46 | HATCOL 1106 (1.15) | SOLSPERSE 24000 (0.13) | — | DP 1 (3.55) (0.25) | DP 2 (6.50) (3.0) | DP 2 (11.0) (30) |
| Example 47 (2) | HATCOL 1106 (0.51) | SOLSPERSE 24000 (0.31) | — | DP 1 (2.54) (0.25) | DP 2 (4.66) (3.0) | DP 2 (7.94) (30) |
| Example 48 (2) | HATCOL 1106 (0.35) | SOLSPERSE 24000 (0.46) | — | DP 1 (2.53) (0.25) | DP 2 (4.67) (3.0) | DP 2 (7.96) (30) |
| Example 49 | HATCOL 1106 (0.51) | SOLSPERSE 39000 (0.46) | — | DP 1 (2.39) (0.25) | DP 2 (4.69) (3.0) | DP 2 (7.94) (30) |
| Example 50 (2) | HATCOL 1106 (0.73) | SOLSPERSE 24000 (0.21) | — | DP 2 (2.14) (1.0) | DP 2 (2.99) (6.0) | DP 2 (3.97) (30) |
| Example 51 (2) | HELOXY 71 (0.74) | SOLSPERSE 24000 (0.21) | — | DP 2 (2.12) (1.0) | DP 2 (2.96) (6.0) | DP 2 (3.98) (30) |
| Example 52 (2) | HATCOL 1106 (0.74) | SOLSPERSE 24000 (0.25) | — | DP 1 (2.10) (0.5) | DP 2 (2.98) (6.0) | DP 2 (4.00) (45) |
| Example 53 (2) | HELOXY 71 (0.76) | SOLSPERSE 24000 (0.24) | — | DP 1 (2.10) (0.5) | DP 2 (2.97) (6.0) | DP 2 (3.98) (45) |
| Example 54 (2) | HELOXY 71 (0.63) | SOLSPERSE 24000 (0.04) | — | DP 1 (2.25) (0.25) | DP 2 (3.08) (3.0) | DP 2 (4.05) (30) |
| Example 55 | HELOXY 71 (0.64) | SOLSPERSE 39000 (0.16) | — | DP 1 (2.19) (0.25) | DP 2 (3.06) (3.0) | DP 2 (4.05) (30) |
| Example 56 | HELOXY 71 (0.45) | SOLSPERSE 39000 (0.15) | — | DP 1 (1.78) (0.25) | DP 2 (3.04) (3.0) | DP 2 (4.63) (30) |
| Example 57 | HELOXY 71 (0.55) | SOLSPERSE 39000 (0.15) | — | DP 1 (1.90) (0.25) | DP 2 (3.02) (3.0) | DP 2 (4.28) (30) |
| Example 58 | HATCOL 2949 (0.64) | SOLSPERSE 39000 (0.17) | — | DP 1 (2.17) (0.25) | DP 2 (3.02) (3.0) | DP 2 (4.03) (30) |
| Example 59 | HATCOL 2300 (0.64) | SOLSPERSE 39000 (0.17) | — | DP 1 (2.19) (0.25) | DP 2 (3.02) (3.0) | DP 2 (4.02) (30) |
| Example 60 | HATCOL 2999 (0.64) | SOLSPERSE 39000 (0.17) | — | DP 1 (2.16) (0.25) | DP 2 (3.04) (3.0) | DP 2 (4.01) (30) |
| Example 61 | HATCOL 5150 (0.64) | SOLSPERSE 39000 (0.17) | — | DP 1 (2.19) (0.25) | DP 2 (3.03) (3.0) | DP 2 (4.03) (30) |

TABLE 1-continued

| Example | Carrier Oil (g) | Dispersant (g) | Disperant (g) | Particle (g) (D$_{50}$, µm) | Particle (g) (D$_{50}$, µm) | Particle (g) (D$_{50}$, µm) |
|---|---|---|---|---|---|---|
| Example 62 | HELOXY 505 (0.63) | SOLSPERSE 39000 (0.17) | — | DP 1 (2.14) (0.25) | DP 2 (3.03) (3.0) | DP 2 (4.04) (30) |
| Example 63 | HELOXY 71 (0.78) | SOLSPERSE 39000 (0.17) | — | GC 8000 (2.12) | GC 2000 (2.98) | F180 SiC (3.96) |
| Example 64 | HELOXY 71 (0.70) | SOLSPERSE 39000 (0.20) | — | DP 1 (1.91) (0.25) | GC 4000 (2.67) | GC 700 (3.54) |

(1) Example 44 contained a 4$^{th}$ thermally conductive particle: DP 2, (4.41 grams), (60 µm).
(2) Examples 46-48 and 50-54 used 0.25, 0.50, or 1.0 µm pre-dispersed diamond particles prepared according to the Milling Procedure and Sample Preparation described above.

Examples A-N and 65-74

Except as noted below, the components were individually weighed into a watch glass and mixed as follows. The silica, antioxidant, dispersants, and the carrier oil were initially combined with both the fine and the medium thermally conductive particles by stirring with a metal spatula until the combination of ingredients was a smooth and uniform blend. The largest particles were then added and the contents of the watch glass were again stirred/kneaded with the metal spatula until the composite was a smooth and uniform blend. If necessary, the thermally conductive grease composition was heated in an oven (110° C.) to reduce the viscosity of the composition to facilitate mixing of the thermally conductive particles and/or subsequent additions of thermally conductive particles. The resultant thermally conductive greases were transferred into and stored in capped glass vials.

The preparation of certain samples was the same as above except that about 16.5 grams of a pre-blend of antioxidant, silica, dispersants, and carrier fluid was prepared. The mixture was stirred with a metal spatula until the combination of ingredients was a smooth and uniform blend. Then on a clean watch glass about 0.824 gram of the pre-blend and both the fine and the medium thermally conductive particles were combined with stirring, followed by the largest particles. The certain samples and the pre-blend compositions are described below.

| "Pre-blend A" Component | Added to Blend (g) | "Pre-blend B" Component | Added to Blend (g) |
|---|---|---|---|
| HATCOL 1106 | 9.10 | HATCOL 1106 | 8.49 |
| SOLSPERSE 39000 | 5.50 | SOLSPERSE 16000 | 5.52 |
| RHODAFAC RE610 | 1.83 | RHODAFAC RE610 | 1.84 |
| IRGANOX 1010 | 0.0076 | IRGANOX 1010 | 0.159 |
| Colloidal Silica | 0.025 | Colloidal Silica | 0.479 |
| Total Weight: | 16.4626 | Total Weight: | 16.488 |

Examples J, K, L, and I were prepared using Pre-blend A. Examples 65, 67, and 71 and Examples M and N were prepared using Pre-blend B.

TABLE 2

| Example | Carrier Oil (g) | Dispersant (g) | Dispersant (g) | Antioxidant (g) Silica (g) | Particle (g) D$_{50}$ (µ) | Particle (g) D$_{50}$ (µ) | Particle (g) D$_{50}$ (µ) |
|---|---|---|---|---|---|---|---|
| Example I | HATCOL 1106 (0.45) | SOLSPERSE 39000 (0.27) | RHODAFAC RE-610 (0.09) | IRGANOX 1010 (0.0004) OX-50 (0.0013) | KADOX 911 (1.31) (0.1) | Sph. Al (2.62) (3-4.5) | WA500 (5.24) (30) |
| Example J | HATCOL 1106 (0.45) | SOLSPERSE 39000 (0.27) | RHODAFAC RE-610 (0.09) | IRGANOX 1010 (0.0004) OX-50 (0.0013) | KADOX 911 (1.30) (0.1) | Sph. Al (2.62) (3-4.5) | GC F320 (5.24) (29) |
| Example A | HATCOL 1106 (0.42) | SOLSPERSE 16000 (0.27) | RHODAFAC RE-610 (0.09) | IRGANOX 1010 (0.0075) OX-50 (0.024) | KADOX 911 (1.31) (0.1) | Sph. Al (2.62) (3-4.5) | GC600 (5.24) (20) |
| Example B | HATCOL 1106 (0.42) | SOLSPERSE 16000 (0.27) | RHODAFAC RE-610 (0.09) | IRGANOX 1010 (0.0081) OX-50 (0.028) | KADOX 930 (1.31) (0.3) | Sph. Al (2.62) (3-4.5) | GC600 (5.24) (20) |
| Example C | HATCOL 1106 (0.52) | SOLSPERSE 16000 (0.27) | RHODAFAC RE-610 (0.09) | IRGANOX 1010 (0.0077) OX-50 (0.027) | KADOX 930 (1.29) (0.3) | Sph. Al (2.59) (3-4.5) | GC600 (5.18) (20) |

TABLE 2-continued

| Example | Carrier Oil (g) | Dispersant (g) | Dispersant (g) | Antioxidant (g) Silica (g) | Particle (g) $D_{50}$ (μ) | Particle (g) $D_{50}$ (μ) | Particle (g) $D_{50}$ (μ) |
|---|---|---|---|---|---|---|---|
| Example 65 | HATCOL 1106 (0.42) | SOLSPERSE 16000 (0.27) | RHODAFAC RE-610 (0.09) | IRGANOX 1010 (0.0080) OX-50 (0.024) | KADOX 911 (1.31) (0.1) | WA6000 (2.62) (2.0) | Sph. Al (5.24) (17-30) |
| Example 66 | HATCOL 1106 (0.52) | SOLSPERSE 16000 (0.27) | RHODAFAC RE-610 (0.09) | IRGANOX 1010 (0.0090) OX-50 (0.027) | KADOX 930 (1.29) (0.3) | GC6000 (2.59) (2.0) | Sph. Al (5.18) (17-30) |
| Example 67 | HATCOL 1106 (0.42) | SOLSPERSE 16000 (0.27) | RHODAFAC RE-610 (0.09) | IRGANOX 1010 (0.0079) OX-50 (0.023) | KADOX 911 (1.31) (0.1) | GC6000 (2.62) (2.0) | Sph. Al (5.24) (17-30) |
| Example K | HATCOL 1106 (0.45) | SOLSPERSE 39000 (0.27) | RHODAFAC RE-610 (0.09) | IRGANOX 1010 (0.0004) OX-50 (0.0013) | T Dia. (1.30) (0.25) | G Dia. (2.62) (3.0) | G Dia. (5.24) (30) |
| Example D | HATCOL 1106 (0.42) | SOLSPERSE 16000 (0.27) | RHODAFAC RE-610 (0.09) | IRGANOX 1010 (0.0087) OX-50 (0.024) | T Dia. (1.31) (0.25) | G Dia. (2.62) (3.0) | G Dia. (5.24) (30) |
| Example E | HATCOL 1106 (0.42) | SOLSPERSE 16000 (0.27) | RHODAFAC RE-610 (0.09) | IRGANOX 1010 (0.0077) OX-50 (0.026) | H Dia. (1.31) (0.25) | H Dia. (2.62) (2-3) | H Dia. (5.24) (20-30) |
| Example 68 | HATCOL 1106 (0.42) | SOLSPERSE 16000 (0.27) | RHODAFAC RE-610 (0.09) | IRGANOX 1010 (0.0080) OX-50 (0.022) | KADOX 911 (1.31) (0.1) | G Dia. (2.62) (1.5) | Sph. Al (5.24) (3-4.5) |
| Example 69 | HATCOL 1106 (0.42) | SOLSPERSE 16000 (0.27) | RHODAFAC RE-610 (0.09) | IRGANOX 1010 (0.0076) OX-50 (0.0022) | KADOX 930 (1.31) (0.3) | G. Dia. (2.62) (3.0) | Sph. Al (5.24) (17-30) |
| Example 70 | HATCOL 1106 (0.42) | SOLSPERSE 16000 (0.27) | RHODAFAC RE-610 (0.09) | IRGANOX 1010 (0.0092) OX-50 (0.023) | KADOX 911 (1.31) (0.1) | G. Dia. (2.62) (1.5) | Sph. Al (5.24) (17-30) |
| Example 71 | HATCOL 1106 (0.42) | SOLSPERSE 16000 (0.27) | RHODAFAC RE-610 (0.09) | IRGANOX 1010 (0.0079) OX-50 (0.023) | KADOX 911 (1.31) (0.1) | H Dia. (2.62) (2-3) | Sph. Al (5.24) (17-30) |
| Example M | HATCOL 1106 (0.42) | SOLSPERSE 16000 (0.27) | RHODAFAC RE-610 (0.09) | IRGANOX 1010 (0.0080) OX-50 (0.024) | KADOX 911 (1.30) (0.1) | H Dia. (2.62) (2-3) | H Dia. (5.24) (20-30) |
| Example L | HATCOL 1106 (0.45) | SOLSPERSE 39000 (0.27) | RHODAFAC RE-610 (0.09) | IRGANOX 1010 (0.0004) OX-50 (0.0013) | KADOX 911 (1.31) (0.1) | Sph. Al (2.62) (3-4.5) | G Dia. (5.24) (30) |
| Example N | HATCOL 1106 (0.45) | SOLSPERSE 16000 (0.27) | RHODAFAC RE-610 (0.09) | IRGANOX 1010 (0.0004) OX-50 (0.024) | KADOX 911 (1.31) (0.1) | Sph. Al (2.62) (3-4.5) | H Dia. (5.24) (20-30) |
| Example 72 | HATCOL 1106 (0.35) | SOLSPERSE 16000 (0.17) | RHODAFAC RE-610 (0.06) | IRGANOX 1010 (0.0066) OX-50 (0.018) | KADOX 911 (0.583) (0.1) | G Dia. (1.18) (3.0) | Nickel (7.64) (−400 Mesh) |
| Example 73 | HATCOL 1106 (0.16) | SOLSPERSE 16000 (0.09) | RHODAFAC RE-610 (0.04) | IRGANOX 1010 (0.0027) OX-50 (0.0085) | KADOX 911 (0.310) (0.1) | GC4000 (0.572) (3.0) | Tungsten (8.81) (−325 Mesh) |

TABLE 2-continued

| Example | Carrier Oil (g) | Dispersant (g) | Dispersant (g) | Antioxidant (g) Silica (g) | Particle (g) $D_{50}$ (μ) | Particle (g) $D_{50}$ (μ) | Particle (g) $D_{50}$ (μ) |
|---|---|---|---|---|---|---|---|
| Example 74 | HATCOL 1106 (0.16) | SOLSPERSE 16000 (0.09) | RHODAFAC RE-610 (0.04) | IRGANOX 1010 (0.0042) OX-50 (0.010) | KADOX 911 (0.300) (0.1) | G Dia. (0.62) (3.0) | Tungsten (8.77) (−325 Mesh) |
| Example F | HATCOL 1106 (0.42) | SOLSPERSE 16000 (0.28) | RHODAFAC RE-610 (0.09) | IRGANOX 1010 (0.0077) OX-50 (0.024) | KADOX 911 (0.789) (0.1) | Sph. Nickel (4.16) (<5) | H Dia. (4.23) (20-30) |
| Example G | HATCOL 1106 (0.29) | SOLSPERSE 16000 (0.19) | RHODAFAC RE-610 (0.06) | IRGANOX 1010 (0.0070) OX-50 (0.015) | KADOX 911 (0.538) (0.1) | Tungsten (6.24) (1-5) | GC600 (2.66) (20) |
| Example H | HATCOL 1106 (0.28) | SOLSPERSE 16000 (0.19) | RHODAFAC RE-610 (0.06) | IRGANOX 1010 (0.0048) OX-50 (0.015) | KADOX 911 (0.539) (0.1) | Tungsten (6.07) (1-5) | H Dia. (2.84) (20-30) |

TABLE 3

| Example | Bulk Conductivity (W/m-K) | Thermal Impedance at 100 μm meter bar gap (° C.-cm²/W) |
|---|---|---|
| 1 | 3.71 | 0.497 |
| 2 | 3.50 | 0.542 |
| 3 | 2.86 | 0.555 |
| 4 | 4.18 | 0.518 |
| 5 | 3.53 | 0.476 |
| 6 | 3.21 | 0.602 |
| 7 | 4.19 | 0.355 |
| 8 | 3.74 | 0.520 |
| 9 | 3.42 | 0.548 |
| 10 | 3.84 | 0.431 |
| 11 | 4.24 | 0.444 |
| 12 | 3.52 | 0.425 |
| 13 | 3.71 | 0.528 |
| 14 | 3.78 | 0.464 |
| 15 | 3.77 | 0.532 |
| 16 | 3.58 | 0.555 |
| 17 | 4.24 | 0.644 |
| 18 | 3.86 | 0.547 |
| 19 | 3.15 | 0.482 |
| 20 | 3.54 | 0.616 |
| 21 | 3.62 | 0.622 |
| 22 | 4.10 | 0.608 |
| 23 | 3.71 | 0.638 |
| 24 | 3.91 | 0.580 |
| 25 | 3.95 | 0.545 |
| 26 | 3.93 | 0.63 |
| 27 | 3.44 | 0.605 |
| 28 | 3.44 | 0.604 |
| 29 | 4.45 | 0.652 |
| 30 | 3.49 | 0.628 |
| 31 | 3.84 | 0.625 |
| 32 | 3.65 | 0.582 |
| 33 | 3.28 | 0.507 |
| 34 | 3.01 | 0.569 |
| 35 | 3.63 | 0.595 |
| 36 | 5.01 | 0.409 |
| 37 | 4.92 | 0.389 |
| 38 | 4.58 | 0.451 |
| 39 | 3.71 | 0.464 |
| 40 | 4.47 | 0.514 |
| 41 | 4.23 | 0.451 |
| 42 | 2.73 | 0.412 |
| 43 | 3.52 | 0.662 |
| 44 | 5.88 | 0.491 |
| 45 | 5.62 | 0.519 |
| 46 | 4.35 | 0.473 |
| 47 | 6.31 | 0.421 |
| 48 | 6.80 | 0.388 |
| 49 | 6.12 | 0.395 |
| 50 | 3.18 | 0.821 |
| 51 | 3.33 | 0.728 |
| 52 | 2.78 | 0.871 |
| 53 | 2.96 | 0.839 |
| 54 | 4.11 | 0.535 |
| 55 | 4.00 | 0.403 |
| 56 | 5.22 | 0.351 |
| 57 | 4.92 | 0.372 |
| 58 | 2.44 | 0.398 |
| 59 | 3.35 | 0.514 |
| 60 | 3.62 | 0.562 |
| 61 | 3.56 | 0.596 |
| 62 | 4.18 | 0.501 |
| 63 | 4.24 | 0.644 |
| 64 | 2.73 | 0.412 |
| Example I | 3.94 | 0.374 |
| Example J | 4.78 | 0.275 |
| Example A | 4.64 | 0.327 |
| Example B | 4.59 | 0.336 |
| Example C | 3.80 | 0.411 |
| Example 65 | 4.81 | 0.323 |
| Example 66 | 5.06 | 0.310 |
| Example 67 | 6.12 | 0.261 |
| Example K | 4.96 | 0.277 |
| Example D | 5.05 | 0.315 |
| Example E | 4.61 | 0.322 |
| Example 68 | 5.50 | 0.280 |

TABLE 3-continued

| Example | Bulk Conductivity (W/m-K) | Thermal Impedance at 100 μm meter bar gap (° C.-cm$^2$/W) |
|---|---|---|
| Example 69 | 5.31 | 0.306 |
| Example 70 | 5.27 | 0.263 |
| Example 71 | 5.16 | 0.288 |
| Example 72 | 3.30 | 0.395 |
| Example 73 | 4.32 | 0.404 |
| Example 74 | 3.94 | 0.404 |
| Example M | 5.08 | 0.304 |
| Example L | 4.27 | 0.346 |
| Example N | 4.88 | 0.325 |
| Example F | 3.23 | 0.377 |
| Example G | 3.24 | 0.405 |
| Example H | 3.40 | 0.405 |
| CE 1 | 2.49 | 0.766 |
| CE 2 | 2.54 | 0.665 |
| CE 3 | 3.44 | 0.383 |
| CE 4 | 3.39 | 0.344 |

CE 1 = ShinEtsu G751, Sample 1
CE 2 = ShinEtsu G751, Sample 2
CE 3 = Dow Corning TC5022
CE 4 = ShinEtsu G751, Sample 3

TABLE 4

| Example | 0.5 mm Gap η(mPa·s) @ 25° C. & 1.25/sec Shear Rate | 0.25 & 0.5 mm Gap Ave. η(mPa·s) @ 125° C. & 1.25/sec Shear Rate | 0.25 mm Gap η(mPa·s) @ 125° C. & 1.25/sec Shear Rate |
|---|---|---|---|
| 26 | — | 4.4E + 04 | 5.8E + 04 |
| 28 | — | 1.1E + 06 | 1.0E + 06 |
| 30 | 2.7E + 06 | — | 1.3E + 04 |
| 31 | — | 9.2E + 04 | 7.9E + 04 |
| 32 | — | 2.5E + 04 | 3.8E + 04 |
| 35 | — | — | 1.7E + 04 |
| 43 | — | 4.2E + 04 | 2.9E + 04 |
| 44 | — | — | 2.4E + 05 |
| 45 | 4.4E + 06 | — | — |
| CE | 1.2E + 06 | 4.3E + 05 | 3.1E + 05 |

CE = ShinEtsu G751

Foreseeable modifications and alterations of this invention will be apparent to those skilled in the art without departing from the scope and spirit of this invention. This invention should not be restricted to the embodiments that are set forth in this application for illustrative purposes.

What is claimed is:

1. A thermally conductive grease comprising:
0 to about 49.5 weight percent of carrier oil;
about 0.5 to about 5 weight percent of at least one polymeric dispersant; and
at least about 49.5 weight percent of thermally conductive particles, wherein the thermally conductive particles comprise a mixture of at least three distributions of thermally conductive particles, each of the at least three distributions of thermally conductive particles having an average ($D_{50}$) particle size which differs from the other distributions by at least a factor of 5, and further wherein the thermally conductive grease exhibits a bulk thermal conductivity of from about 2 to about 7 W/m-° K. and a viscosity measured at 25° C. of at least about $10^6$ mPas.

2. The thermally conductive grease of claim 1 wherein each of the at least three distributions of thermally conductive particles having an average ($D_{50}$) particle size which differs from the others by at least a factor of 7.5.

3. The thermally conductive grease of claim 1 wherein each of the at least three distributions of thermally conductive particles having an average ($D_{50}$) particle size which differs from the others by at least a factor of 10.

4. The thermally conductive grease of claim 1 wherein the thermally conductive particles comprise materials selected from the group consisting of diamond, silicon carbide, alumina, boron nitride (hexagonal or cubic), boron carbide, silica, graphite, amorphous carbon, polycrystalline diamond, aluminum nitride, aluminum, zinc oxide, nickel, tungsten, silver, and combinations thereof.

5. The thermally conductive grease of claim 1 further comprising at least one additional dispersant selected from the group consisting of nonionic, dispersants, polymeric dispersants, ionic dispersants, inorganic dispersants, and combinations thereof, in an amount from about 0.5 to about 20 weight percent.

6. The thermally conductive grease of claim 1 wherein carrier oil is present in an amount of from about 0.5 to about 20 weight percent.

7. The thermally conductive grease of claim 1 wherein one of the at least three distributions of thermally conductive particles has an average particle size that ranges from about 0.02 to about 5 micrometers.

8. The thermally conductive grease of claim 1 wherein one of the at least three distributions of thermally conductive particles has an average particle size that ranges from about 0.10 to about 50.0 micrometers.

9. The thermally conductive grease of claim 1 wherein one of the at least three distributions of thermally conductive particles has an average particle size that ranges from about 0.50 to about 500 micrometers.

10. The thermally conductive grease of claim 1 wherein the at least one polymeric dispersant comprises an ionic dispersant in addition to the polymeric dispersant.

11. The thermally conductive grease of claim 1 further comprising a fourth distribution of thermally conductive particles.

12. The thermally conductive grease of claim 1 wherein the thermally conductive particles comprise a mixture of diamond and silicon carbide particles.

13. The thermally conductive grease of claim 1 wherein the at least three distributions of thermally conductive particles are essentially non-overlapping.

14. The thermally conductive grease of claim 1 wherein the at least three distributions of thermally conductive particles have a minimal overlap.

15. The thermally conductive grease of claim 1 wherein the distribution of particles having a largest average ($D_{50}$) particle size comprises metal particles.

16. The thermally conductive grease of claim 15 wherein the thermally conductive particles comprise a mixture of diamond and metal particles.

17. The thermally conductive grease of claim 15 wherein the distribution of particles having a middle average ($D_{50}$) particle size comprises silicon carbide or diamond particles.

18. The thermally conductive grease of claim 15 wherein the distribution of particles having a smallest average ($D_{50}$) particle size comprises zinc oxide particles.

19. The thermally conductive grease of claim 15 wherein the distribution of particles having a largest average ($D_{50}$) particle size comprises spherical aluminum particles.

20. The thermally conductive grease of claim 11 wherein the thermally conductive particles comprise materials selected from the group consisting of diamond, silicon carbide, alumina, tungsten, nickel, boron nitride (hexagonal or cubic), boron carbide, silica, graphite, amorphous carbon, polycrystalline diamond, aluminum nitride, aluminum, silver, zinc oxide, and combinations thereof.

21. The thermally conductive grease of claim 1 wherein the thermally conductive particles in at least one of the at least three distributions of thermally conductive particles comprises a mixture of at least two different types of thermally conductive particles.

22. The thermally conductive grease of claim 1 wherein the thermally conductive particles in at least one of the at least three distributions of thermally conductive particles contain thermally conductive particles of a type different from the thermally conductive particles in the other particle distributions.

* * * * *